United States Patent
Noguchi

(10) Patent No.: US 9,609,741 B1
(45) Date of Patent: Mar. 28, 2017

(54) PRINTED CIRCUIT BOARD AND ELECTRONIC APPARATUS

(71) Applicant: CANON KABUSHIKI KAISHA, Tokyo (JP)

(72) Inventor: Koji Noguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/272,201

(22) Filed: Sep. 21, 2016

(30) Foreign Application Priority Data

Sep. 24, 2015 (JP) ................................. 2015-186700

(51) Int. Cl.
   - *H05K 7/00* (2006.01)
   - *H05K 1/02* (2006.01)
   - *H05K 1/18* (2006.01)

(52) U.S. Cl.
   CPC .......... *H05K 1/0203* (2013.01); *H05K 1/181* (2013.01); *H05K 2201/06* (2013.01); *H05K 2201/09227* (2013.01); *H05K 2201/09372* (2013.01); *H05K 2201/10015* (2013.01)

(58) Field of Classification Search
   USPC .......................... 361/783, 760, 717; 257/678
   See application file for complete search history.

(56) References Cited

U.S. PATENT DOCUMENTS

| | | | |
|---|---|---|---|
| 6,324,067 B1* | 11/2001 | Nishiyama | H05K 1/165 174/262 |
| 2011/0031610 A1* | 2/2011 | Yamazaki | H01L 23/4985 257/693 |

FOREIGN PATENT DOCUMENTS

JP        4396005 A        1/2010

* cited by examiner

*Primary Examiner* — Andargie M Aychillhum
(74) *Attorney, Agent, or Firm* — Canon U.S.A. Inc., IP Division

(57) ABSTRACT

A printed wiring board has thereon an electronic component having a heat radiation pad, and an electrolytic capacitor provided for the electronic component. The printed wiring board further has thereon another electronic component having another heat radiation pad and exhibiting a higher heat value than that of the electronic component, and another electrolytic capacitor provided for the other electronic component. The heat radiation pad of the electronic component, a ground terminal of the electrolytic capacitor, the other heat radiation pad for the other electronic component, and another ground terminal of the other electrolytic capacitor are connected by using a ground conductor. In the ground conductor, a thermal resistance between the other heat radiation pad and other ground terminal is lower than the thermal resistance between the heat radiation pad and the ground terminal.

13 Claims, 12 Drawing Sheets

PRINTED CIRCUIT BOARD AND ELECTRONIC APPARATUS

BACKGROUND OF THE INVENTION

Field of the Invention

Embodiments of the present invention relate to a printed circuit board having an electronic component which generates heat and an electronic apparatus including the printed circuit board.

Description of the Related Art

In order to avoid performance degradation due to temperature increases, countermeasures against heat may be required in an electronic component which generates heat, such as a driver IC configured to drive a motor. As such countermeasures against heat, an increased number of electronic components have a heat radiation pad (heat sink) in recent years.

The heat generated from such an electronic component is conducted from a heat radiation pad of the electronic component through a conductive jointing material of solder, for example, to heat radiation lands on a printed wiring board. The heat conducted to the heat radiation lands is then conducted to a plane-shaped conductor pattern on an opposite surface of a surface having an electronic component or in an inner layer through a via conductor placed in the heat radiation lands and is dissipated into the air. When the heat radiation only with such a conductor pattern is not sufficient, countermeasures against heat are provided such as attaching a heat sink thereto. On the other hand, because of increased needs for downsizing and cost reduction of products, it has been desired not only to refrain from use of a heat sink but also to reduce the size of the printed circuit board.

Accordingly, a technology has been proposed (as in Japanese Patent No. 4396005) in the past which includes a circuit component different from an electronic component on the opposite surface of a surface having the electronic component thereon so that heat generated from the electronic component is absorbed by the circuit component and is dissipated from the circuit component, without using a heat sink.

However, in a case where a plurality of electronic components which generate heat is mounted on a printed wiring board, thermal interference may occur among the plurality of electronic components. For example, in a case where two electronic components having different heat values from each other are mounted on a printed wiring board, one having a higher heat value of the electronic components is influenced by heat generated from the other electronic component. As a result, the heat radiation is prevented, and the temperature increases. In order to reduce the increase in temperature, increasing the area of the conductor pattern thermally connected to the heat radiation pad may disadvantageously increase the size of the printed circuit board.

SUMMARY OF THE INVENTION

According to an aspect of the present invention, heat from an electronic component can be effectively dissipated without adding a heat sink, and the size of a printed circuit board can be reduced.

A printed circuit board according to an embodiment of the present invention includes a printed wiring board, a first electronic component having a first heat radiation pad, a first circuit component provided for the first electronic component and having a first terminal, a second electronic component having a second heat radiation pad and generating heat exhibiting a higher heat value than that of the first electronic component, a second circuit component provided for the second electronic component and having a second terminal; and a conductor provided on the printed wiring board and having a conductor pattern part. In this case, the first electronic component, the first circuit component, the second electronic component, and the second circuit component are mounted on the printed wiring board, the first heat radiation pad of the first electronic component, the first terminal of the first circuit component, the second heat radiation pad of the second electronic component, and the second terminal of the second circuit component are connected through the conductor, and a thermal resistance between the second heat radiation pad and the first terminal is lower than a thermal resistance between the first heat radiation pad and the first terminal.

According to the invention, heat from an electronic component can be effectively dissipated without adding a heat sink, and the size of a printed circuit board can be reduced.

Further features of the invention will become apparent from the following description of exemplary embodiments with reference to the attached drawings.

DESCRIPTION OF THE EMBODIMENTS

Exemplary embodiments of the present invention will be described in detail with reference to drawings.

First Exemplary Embodiment

Figure 1:
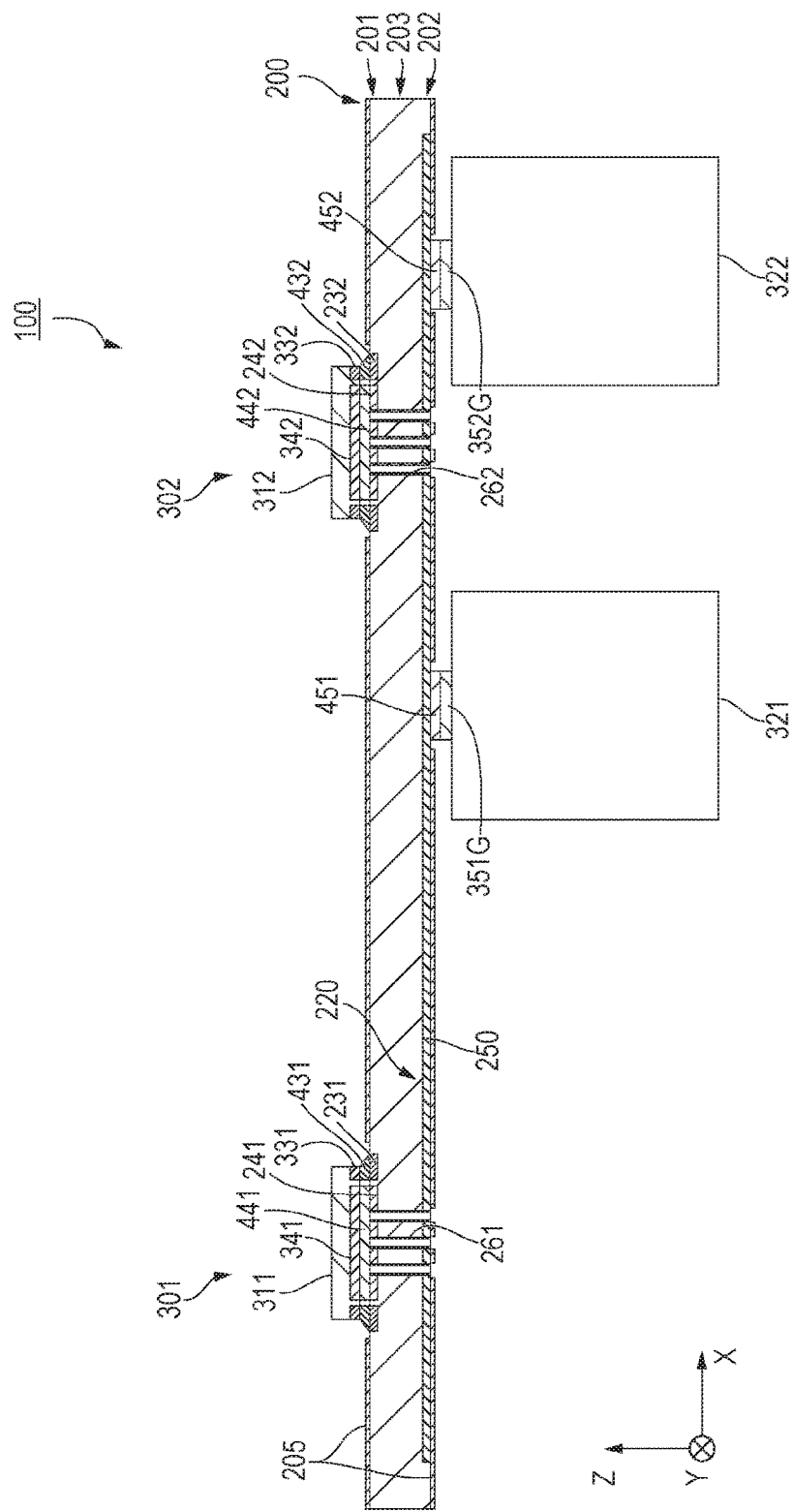
FIG. 1 is a sectional view schematically illustrating a printed circuit board according to a first exemplary embodiment.
Figure 2:
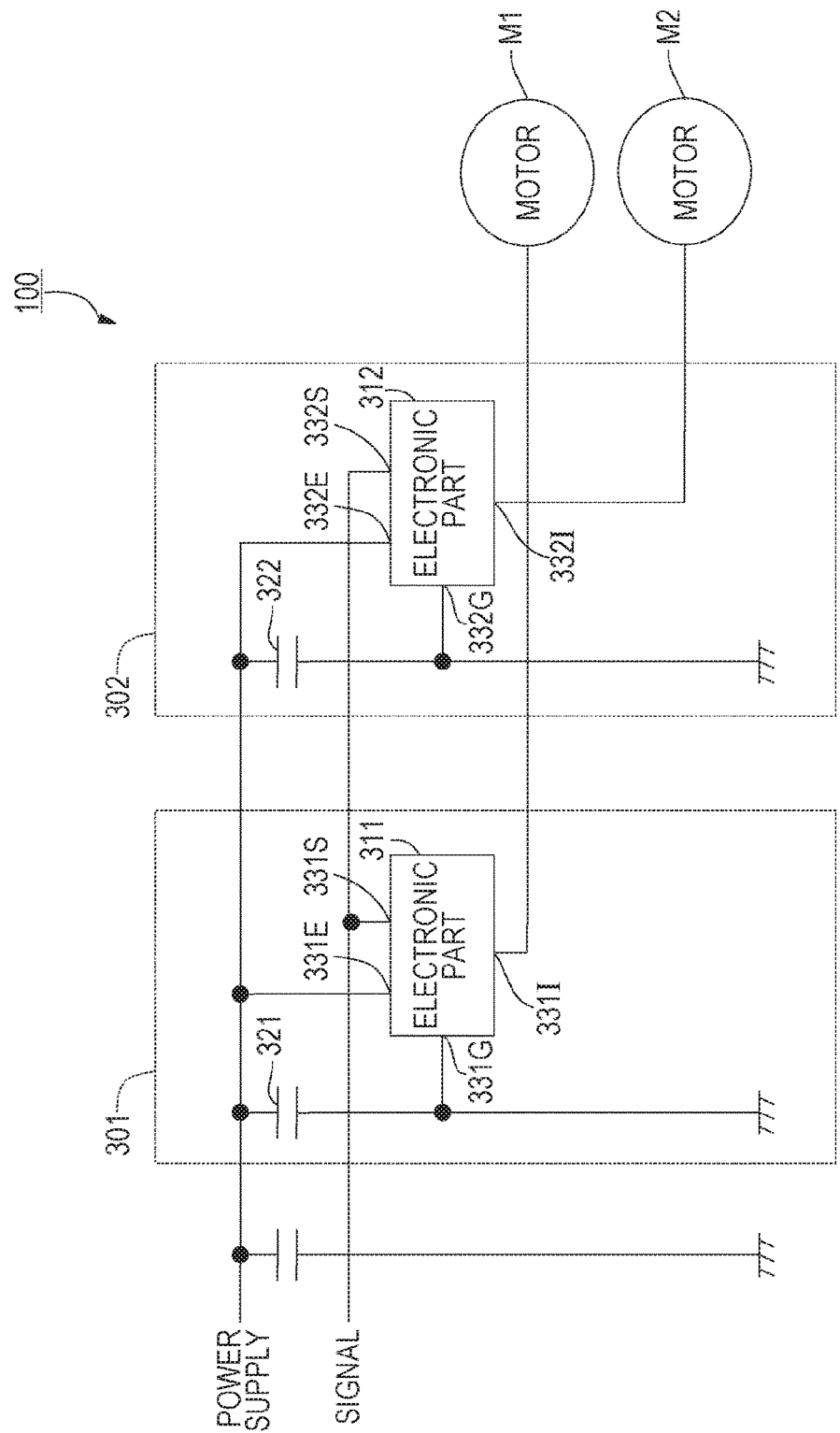
FIG. 2 is an electric circuit diagram illustrating the printed circuit board according to the first exemplary embodiment.

FIG. 1 is a sectional view schematically illustrating a printed circuit board according to a first exemplary embodiment. FIG. 2 is an electric circuit diagram illustrating the printed circuit board according to the first exemplary embodiment. As illustrated in FIG. 1, a printed circuit board 100 includes a printed wiring board 200, a circuit module 301 being a first circuit module, and a circuit module 302 being a second circuit module. The circuit modules 301 and 302 are mounted on the printed wiring board 200. In FIG. 1, a direction horizontal to a surface of the printed wiring board 200 is an X direction, a direction horizontal to a surface of the printed wiring board 200 perpendicular to the X direction is a Y direction, and a direction perpendicular to the surface of the printed wiring board 200 is a Z direction. The printed wiring board 200 is a substrate body on which an electronic component is not mounted, and the printed circuit board 100 has an electronic component and so on mounted on the printed wiring board 200. The printed wiring board 200 has a signal line and so on, which are not illustrated.

The printed wiring board 200 has a plurality of (two in the first exemplary embodiment) conductor layers including conductor layers 201 and 202 stacked through an insulator layer (dielectric layer) 203. According to the first exemplary embodiment, the printed wiring board 200 is a 2-layered printed wiring board. However, the number of layers in the printed wiring board is not limited to two but may be equal to or higher than three.

Each of the conductor layers 201 and 202 mainly has a conductor pattern. Each of the conductor layers 201 and 202 being a surface layer has a solder resist 205 covering the conductor. An insulator layer 203 mainly has an insulator (dielectric).

Here, in the printed wiring board 200, the surface layers are outermost conductor layers (mounting surface) having an electronic component and so on thereon. Between the pair of surface layers, one surface layer (second surface layer) on the opposite side of the other surface layer (first surface layer) will also be called a back layer. The surface layer of the printed wiring board 200 will also be called a front surface (first surface), and the back layer will also be called a back surface (second surface).

The insulator layer 203 may contain an insulator having electrical isolation which may be a hardened resin such as an epoxy resin. The conductor layers 201 and 202 have conductors such as conductor patterns and via conductors (each being a conductor provided in a via) being highly electrically and thermally conductive substances that may be metal such as copper and gold.

As illustrated in FIGS. 1 and 2, the circuit module 301 has an electronic component 311 being a first electronic component and an active element and an electrolytic capacitor 321 being a first circuit component and a passive element. The electronic component 311 and electrolytic capacitor 321 are mounted on the printed wiring board 200. The electronic component 311 is a motor driver configured to drive a motor M1 and supplies electric current to the motor M1 based on an input command. The electrolytic capacitor 321 is provided for the electronic component 311 to reduce power supply noise (power potential variations) in the electronic component 311.

The circuit module 302 has an electronic component 312 being a second electronic component and an active element and an electrolytic capacitor 322 being a second circuit component and a passive element. The electronic component 312 and electrolytic capacitor 322 are mounted on the printed wiring board 200. The electronic component 312 is a motor driver configured to drive a motor M2 and supplies electric current to the motor M2 based on an input command. The electrolytic capacitor 322 is provided for the electronic component 312 and may reduce power supply noise (power potential variations) in the electronic component 312.

Figure 3A:
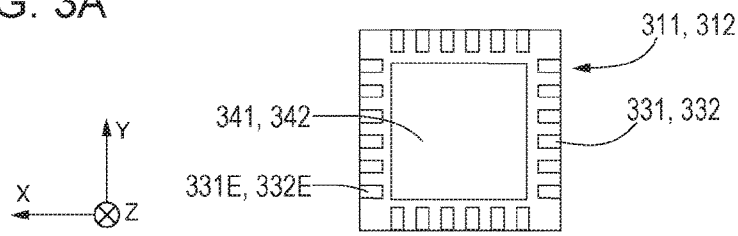
FIG. 3A is a bottom view of first and second electronic components viewed from a +Z direction according to the first exemplary embodiment.

FIG. 3A is a bottom view of the electronic components 311 and 312 viewed from a +Z direction. The electronic component 311 has a plurality of terminals 331 including, more specifically, a power supply terminal 331E, a ground terminal 331G, a signal terminal 331S and an output terminal 331I illustrated in FIG. 2. The electronic component 312 has a plurality of terminals 332 including, more specifically, a power supply terminal 332E, a ground terminal 332G, a signal terminal 332S and an output terminal 332I illustrated in FIG. 2. Each of terminals of the electronic components 311 and 312 is connected to a signal line, a power supply line, a ground line, and a drive signal line and outputs a drive signal (electric current) from the output terminals 331I and 332I to the motors M1 and M2.

According to the first exemplary embodiment, the electronic component 311 is mounted on the surface layer 201 being the first surface layer, and the electrolytic capacitor 321 is mounted on the surface layer 202 being the second surface layer. In other words, the electronic component 311 and the electrolytic capacitor 321 are mounted on mutually different surfaces of the printed wiring board 200. The electronic component 312 is mounted on the surface layer 201, and the electrolytic capacitor 322 is mounted on the surface layer 202. In other words, the electronic component 312 and the electrolytic capacitor 322 are mounted on mutually different surfaces of the printed wiring board 200. The electronic components 311 and 312 are mounted on an identical surface of the printed wiring board 200, and the electrolytic capacitors 321 and 322 are mounted on an identical surface of the printed wiring board 200.

The electronic components 311 and 312 may be configured by a semiconductor package such as an HQFN, an HSON, an HQFP, and an HSOP and include heat radiation pads (heat sinks) 341 and 342, respectively, as illustrated in FIG. 3A.

Figure 3B:
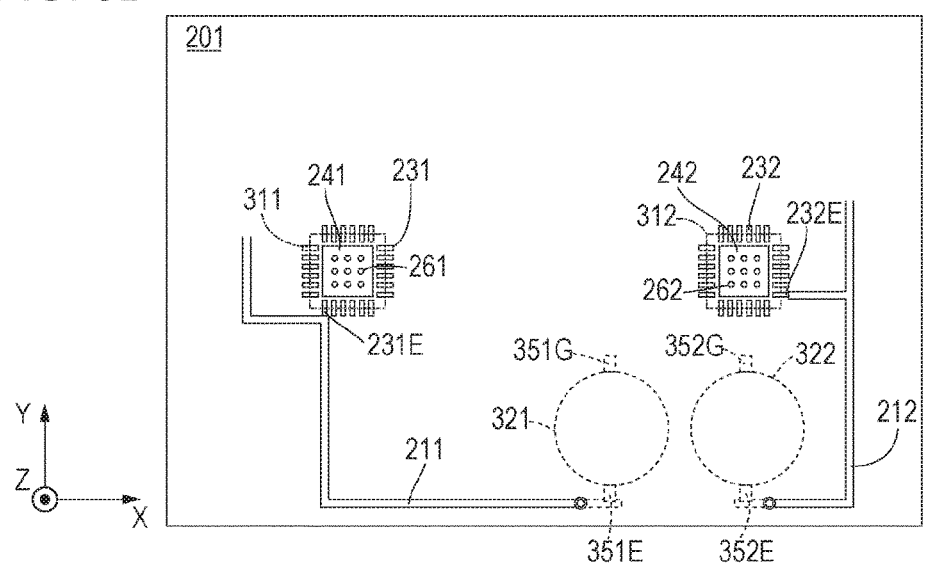
FIG. 3B is a plan view illustrating a first surface layer viewed from a −Z direction of the printed wiring board according to the first exemplary embodiment.
Figure 3C:
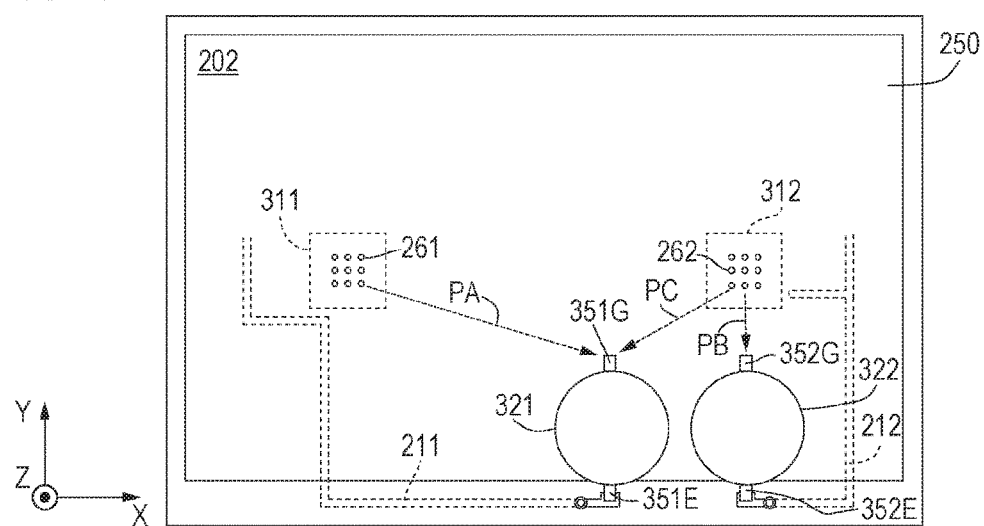
FIG. 3C is a plan view of a second surface layer viewed from the −Z direction of the printed wiring board according to the first exemplary embodiment.

FIG. 3B is a plan view illustrating the first surface layer viewed from a −Z direction of the printed wiring board according to the first exemplary embodiment, and FIG. 3C is a plan view illustrating the second surface layer of the printed wiring board viewed from the −Z direction according to the first exemplary embodiment. In FIG. 3C, the solid lines represent the electrolytic capacitors 321 and 322 for convenience of illustration.

The electrolytic capacitor 321 has a power supply terminal 351E and a ground terminal (first terminal) 351G. The electrolytic capacitor 322 has a power supply terminal 352E and a ground terminal (second terminal) 352G.

The ground terminal 331G of the electronic component 311 and a heat radiation pad 341 being a first heat radiation pad of the electronic component 311 are electrically connected. For example, the ground terminal 331G and the heat radiation pad 341 are connected within the electronic component 311 or may be connected through the printed wiring board 200. The ground terminal 332G of the electronic component 312 and a heat radiation pad 342 being a second heat radiation pad of the electronic component 312 are electrically connected. For example, the ground terminal 332G and heat radiation pad 342 are connected within the electronic component 312 or may be connected through the printed wiring board 200.

The surface layer 201 of the printed wiring board 200 has a plurality of lands (conductor pattern) 231 to which a plurality of terminals 331 of the electronic component 311 is bonded by using an electrically conductive jointing material 431. The surface layer 201 has heat radiation lands (conductor pattern) 241 to which a heat radiation pad 341 of the electronic component 311 is bonded by using an electrically conductive jointing material 441 of solder, for example. The surface layer 201 of the printed wiring board 200 has a plurality of lands (conductor pattern) 232 to which a plurality of terminals 332 of the electronic component 312 are bonded by using an electrically conductive jointing material 432 of solder, for example. Furthermore, the surface layer 201 has heat radiation lands (conductor pattern) 242 to which a heat radiation pad 342 of the electronic component 312 is bonded by using an electrically conductive jointing material 442 of solder, for example.

The surface layer 202 of the printed wiring board 200 has a plane-shaped conductor pattern 250 being a conductor pattern part. The conductor pattern 250 is provided in a region including the electronic components 311 and 312 and the electrolytic capacitors 321 and 323 viewed from the arrow Z direction perpendicular to the surface of the printed wiring board 200. More specifically, the conductor pattern 250 is provided so as to include a projected region acquired by projecting the heat radiation pads 341 and 342 of the electronic components 311 and 312 and the ground terminals 351G and 352G of the electrolytic capacitors 321 and 323 to the conductor layer 202 in the arrow Z direction.

The conductor pattern 250 has a conductor present on a straight line connecting a connection point between the via conductor 261 and the conductor pattern 250 and a connection point between the ground terminal 351G of the electrolytic capacitor 321 and the conductor pattern 250 viewed from the arrow Z direction. Also, the conductor pattern 250 has a conductor present on a straight line connecting between a connection point between the via conductor 262 and the conductor pattern 250 and a connection point between the ground terminal 351G of the electrolytic capacitor 321 and the conductor pattern 250 viewed from the arrow Z direction. The conductor pattern 250 has a conductor present on a straight line connecting a connection point between the via conductor 262 and the conductor pattern 250 and a connection point between the ground terminal 352G of the electrolytic capacitor 322 and the conductor pattern 250 viewed from the arrow Z direction.

The ground terminal 351G of the electrolytic capacitor 321 is bonded to the conductor pattern 250 by using an electrically conductive jointing material 451 of solder, for example, and the ground terminal 352G of the electrolytic capacitor 322 is bonded to the conductor pattern 250 by using an electrically conductive jointing material 452 of solder, for example.

The conductor pattern 250 and the heat radiation lands 241 are connected by using a plurality of via conductors (each being a conductor provided in a via) 261. The conductor pattern 250 and the heat radiation lands 242 are connected by using a plurality of via conductors 262. Viewed from the arrow Z direction, the via conductors 261 are provided within a region of the heat radiation lands 241, and the via conductors 262 are provided within a region of the heat radiation lands 242.

According to the first exemplary embodiment, by using the heat radiation lands 241 and 242, the conductor pattern 250 and via conductors 261 and 262, the ground conductor 220 is provided across the surface layer 201 and the surface layer 202.

In other words, the heat radiation pad 341 of the electronic component 311, the ground terminal 351G of the electrolytic capacitor 321, the heat radiation pad 342 of the electronic component 312, and the ground terminal 352G of the electrolytic capacitor 322 are electrically and thermally connected through the ground conductor 220.

According to the first exemplary embodiment, the printed wiring board 200 has a power supply conductor 211 being a first power supply conductor configured to electrically connect the power supply terminal 351E of the electronic component 311 and the power supply terminal 351E of the electrolytic capacitor 321 across the surface layer 201 and the surface layer 202.

The printed wiring board 200 further has a power supply conductor 212 being a second power supply conductor configured to electrically connect the power supply terminal 352E of the electronic component 312 and the power supply terminal 352E of the electrolytic capacitor 322 across the surface layer 201 and the surface layer 202.

In a case where the electronic components 311 and 312 operate with equal voltage, the power supply conductor 211 and the power supply conductor 212 may be connected through a power supply conductor, not illustrated. In a case where the electronic components 311 and 312 operate with mutually different voltages, the power supply conductor 211 and the power supply conductor 212 may be isolated.

Direct current voltage is applied from a direct current power supply circuit, not illustrated, to between the power supply conductors 211 and 212 and the ground conductor 220, electric power is supplied to the electronic components 311 and 312 so that the electronic components 311 and 312 can operate.

According to the first exemplary embodiment, the electronic component 311 and electronic component 312 generate heat due to an operation for driving the motor. The electronic component 312 then generates heat exhibiting a heat value higher than that of the electronic component 311.

The heat generated from the electronic components 311 and 312 is conducted to the electrolytic capacitors 321 and 322 through the ground conductor 220. The heat conducted to the electrolytic capacitors 321 and 322 is dissipated to the outside air. In this manner, the electrolytic capacitors 321 and 322 provided for countermeasures against power supply noise also function as heat radiation parts. Therefore, no heat sink may be necessary in the printed wiring board 200 for heat radiation for the electronic components 311 and 312.

The electrolytic capacitors 321 and 322 in the first and second circuit components may have higher heat capacities, and aluminum electrolytic capacitors having a higher heat capacity than those of the other electrolytic capacitors are provided according to the first exemplary embodiment.

The electrolytic capacitor 321 is disposed more closely to the electronic component 312 than the electronic component 311, as illustrated in FIG. 1 and FIGS. 3B and 3C. The electrolytic capacitor 322 is also disposed more closely to the electronic component 312 than the electronic component 311 as illustrated in FIG. 1 and FIGS. 3B and 3C.

In the printed circuit board 100, the heat conduction of the electronic components are mainly through a conductor, particularly, the ground conductor 220 because a conductor has a higher heat conductivity than that of an insulator.

According to the first exemplary embodiment, in the ground conductor 220, the thermal resistance between the heat radiation pad 342 and the ground terminal 351G is lower than the thermal resistance between the heat radiation pad 341 and the ground terminal 351G. In other words, in the ground conductor 220, the thermal resistance between the heat radiation pad 341 and the ground terminal 351G is higher than the thermal resistance between the heat radiation pad 342 and the ground terminal 351G.

Figure 4:
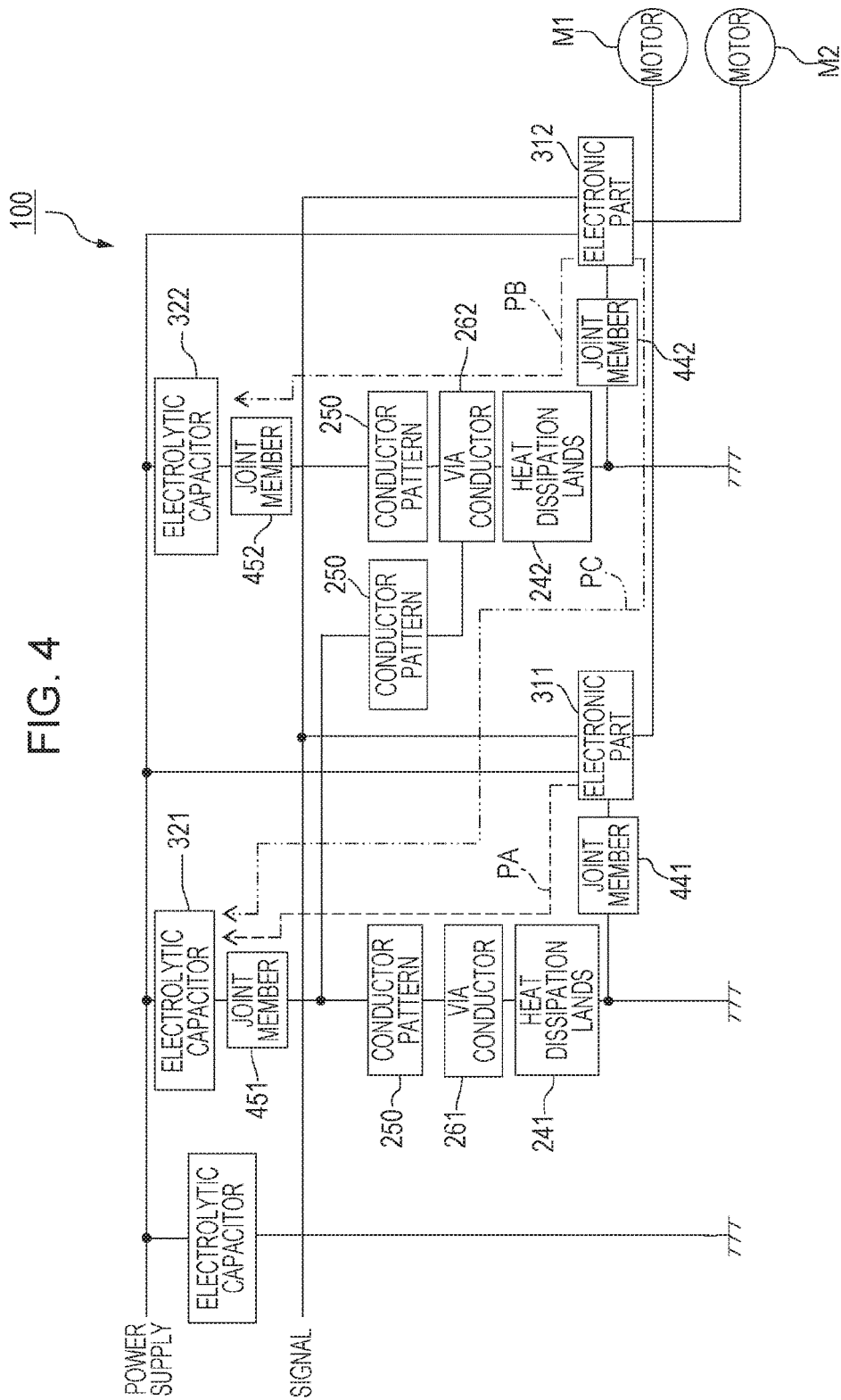
FIG. 4 is an electric circuit diagram illustrating a heat conduction path in the printed circuit board according to the first exemplary embodiment.

FIG. 4 is an electric circuit diagram illustrating a heat conduction path in the printed circuit board according to the first exemplary embodiment. A heat conduction path PA from the heat radiation pad 341 in the electronic component 311 to the ground terminal 351G of the electrolytic capacitor 321 includes the jointing material 441, the heat radiation lands 241, the via conductor 261, the conductor pattern 250, and the jointing material 451.

A heat conduction path PB from the heat radiation pad 342 of the electronic component 312 to the ground terminal 352G of the electrolytic capacitor 322 includes the jointing material 442, the heat radiation lands 242, the via conductor 262, the conductor pattern 250, and the jointing material 452.

A heat conduction path PC from the heat radiation pad 342 in the electronic component 312 to the ground terminal 351G of the electrolytic capacitor 321 includes the jointing material 442, the heat radiation lands 242, the via conductor 262, the conductor pattern 250, and the jointing material 451.

The heat conduction paths PA to PC have thermal resistances dependent on the dimensions and heat conductivities of the materials. In the heat conduction paths PA to PC, the conductor pattern 250 is shared. It can be regarded that the thermal resistances of the jointing material 441 and the jointing material 442, the thermal resistances of the jointing material 451 and the jointing material 452, the thermal resistances of the heat radiation lands 241 and the heat radiation lands 242 and the thermal resistances of the via conductor 261 and the via conductor 262 are equal. Thus, the thermal resistances of the heat conduction paths PA to PC depend on the distances between the connection points of the via conductors 261 and 262 and the connection point of the ground terminal 351G of the electrolytic capacitor 321 in the conductor pattern 250 illustrated in FIG. 3C.

According to the first exemplary embodiment, the electrolytic capacitor 321 is disposed more closely to the electronic component 312 between the electronic component 311 and the electronic component 312. Therefore, in the conductor pattern 250, the distance between the connection point of the via conductor 262 and the connection point of the ground terminal 351G of the electrolytic capacitor 321 is shorter than the distance between the connection point of the via conductor 261 and the connection point of the ground terminal 351G of the electrolytic capacitor 321. As a result, in the ground conductor 220, the thermal resistance between the heat radiation pad 342 and the ground terminal 351G is lower than the thermal resistance between the heat radiation pad 341 and the ground terminal 351G.

Thus, the electrolytic capacitor 321 has an absorption of heat more in the heat conduction from the heat conduction path PC of the electronic component 312 than the heat conduction from the heat conduction path PA in the electronic component 311. Thus, heat generated from the electronic component 312 is not only conducted to the electrolytic capacitor 322 through the heat conduction path PB but also is conducted to the electrolytic capacitor 321 through the heat conduction path PC so that the temperature of the electronic component 312 can be reduced.

In other words, because the thermal resistance of the heat conduction path PA is higher than the thermal resistance of the heat conduction path PC, the amount of heat radiation to the electrolytic capacitor 321 increases even when thermal interference from the electronic component 311 occurs in the electronic component 312. Therefore, the area of the conductor pattern 250 can be reduced, and the size of the printed circuit board 100 having the circuit modules 301 and 302 can be reduced.

The thermal resistance of a conductor satisfies the following expression (1).

$$\theta = L/(K \times W \times t) \quad (1)$$

where $\theta$ (° C./W) is the thermal resistance, L (mm) is a length, K (W/m*° C.) is a heat conductivity, W (mm) is a width, and a thickness is t (mm) of the conductor.

The relationship between the thermal resistance of the heat conduction path PA and the thermal resistance of the heat conduction path PC satisfies the following expression (2).

$$\theta 1 (= L1/(K \times t \times W)) > \theta 3 (= L3/(K \times t \times W)) \quad (2)$$

where L1 and $\theta 1$ are a length and a thermal resistance, respectively, of the heat conduction path PA, L3 and $\theta e$ are a length and a thermal resistance, respectively, of the heat conduction path PC, K, W, and t are a heat conductivity, a width, and a thickness, respectively, of each of the conductors.

and L1>L3.

According to Expression (2), the heat conductivities K, the thicknesses t, and the widths W of the heat conduction path PA and heat conduction path PC are equal. Therefore, from the magnitude relationship between the lengths L1 and L3 of the heat conduction paths, the values of the thermal resistances can be determined. The difference in value between the thermal resistance $\theta 1$ and the thermal resistance $\theta 3$ increases as the length of the heat conduction path PA increases and the length of the heat conduction path PC decreases. Thus, the temperature of the electronic component 312 can be reduced, and the required area of the conductor pattern 250 can be reduced. The thermal resistance between two arbitrary points on the electronic components 311 and 312 and the printed wiring board 200 can be calculated by measuring the lengths, thicknesses, and widths of conductors on the printed wiring board 200 and using Expression (1).

Furthermore, assuming that the thermal resistance of a conductor is θ (° C./W), the heat value of an electronic component is Q (W), a junction temperature of the electronic component is T1 (° C.), and the temperature of an arbitrary point on the printed wiring board is T2 (° C.), the thermal resistance satisfies the following expression (3).

$$\theta=(T1-T2)/Q \quad (3)$$

The thermal resistance between two arbitrary points on the electronic components 311 and 312 and the printed wiring board 200 can be calculated by using Expression (3). The T1 (° C.) that is a junction temperature of an electronic component and the T2 (° C.) that is a temperature at an arbitrary point on a printed wiring board can be measured from a temperature distribution diagram of the printed circuit board by using an apparatus such as a thermograph. In this case, the thermal resistances of the heat conduction paths PA, PB, and PC do not impair the functionality of the circuit modules 301 and 302. The inside of the vias having the via conductors 261 and 262 may be filled with a highly electrically conductive jointing material of solder, for example.

Second Exemplary Embodiment

Figure 5A:
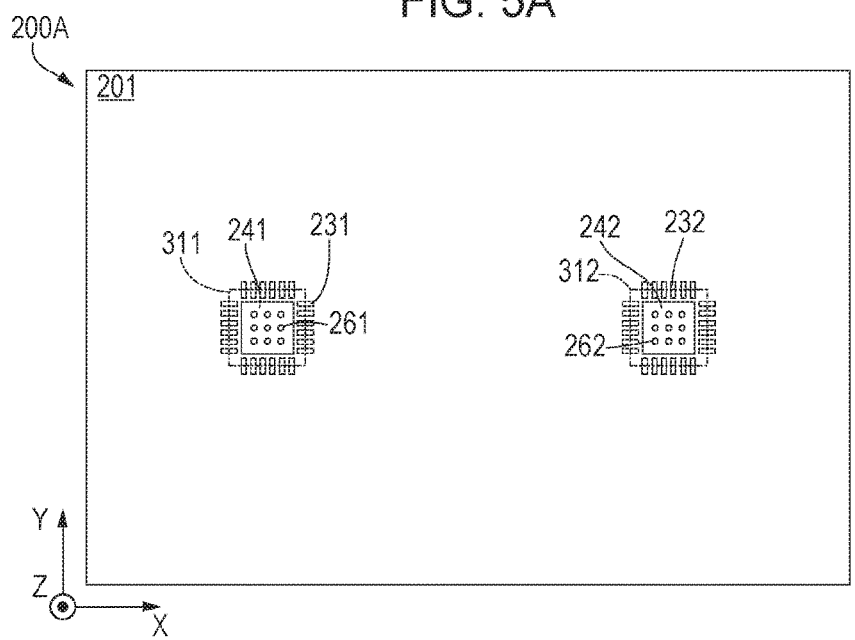
FIG. 5A is a plan view from a −Z direction of a first surface layer of a printed wiring board in a printed circuit board according to a second exemplary embodiment.
Figure 5B:
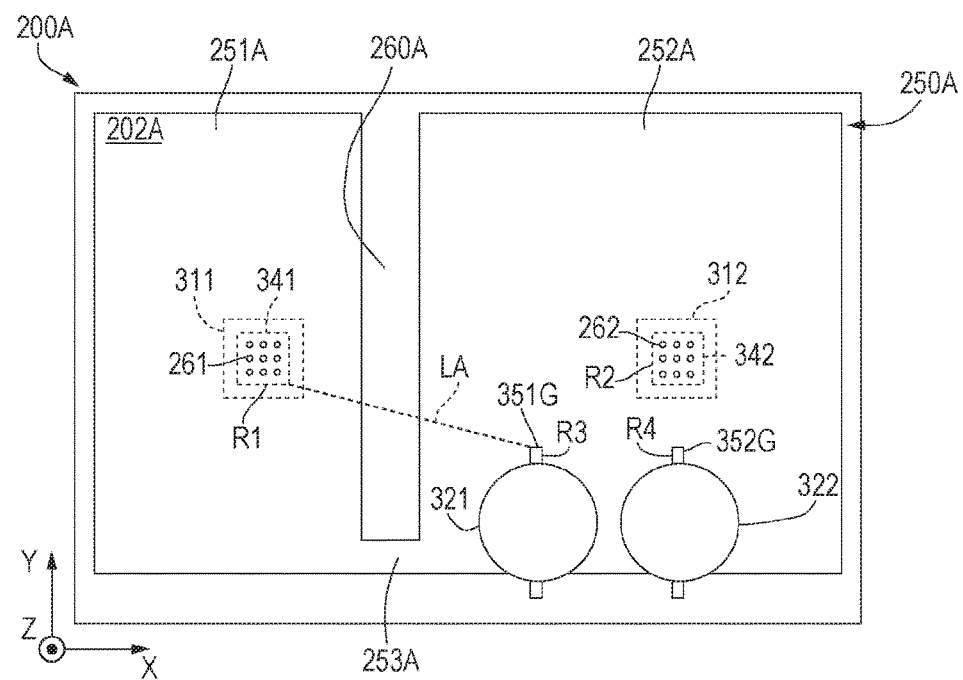
FIG. 5B is a plan view from a −Z direction of a second surface layer of a printed wiring board in a printed circuit board according to the second exemplary embodiment.

Next, a printed circuit board according to a second exemplary embodiment will be described. FIG. 5A is a plan view from a −Z direction of a first surface layer of a printed wiring board in the printed circuit board according to the second exemplary embodiment. FIG. 5B is a plan view from a −Z direction of a second surface layer of the printed wiring board in the printed circuit board according to the second exemplary embodiment. The second exemplary embodiment is different from the first exemplary embodiment in the configuration of a conductor pattern part in the printed wiring board and is the same as the first exemplary embodiment in the other configuration. Like numbers refer to like parts in descriptions and illustrations according to the first and second exemplary embodiments, and repetitive description will be omitted. FIG. 5B illustrates electrolytic capacitors 321 and 322 by using solid lines for convenience of illustration.

A printed wiring board 200A in the printed circuit board according to the second exemplary embodiment has a plurality of (two in the second exemplary embodiment) conductor layers including conductor layers 201 and 202A stacked through an insulator layer (dielectric layer). Referring to FIG. 5A, the wiring of a power supply line and so on, not illustrated, has the same configuration as that of the conductor layer 201 illustrated in FIG. 3B. According to the second exemplary embodiment, the printed wiring board 200A is a 2-layered printed wiring board. The number of layers in the printed wiring board is not limited to two but may be equal to or higher than three.

According to the second exemplary embodiment, the electronic component 311 is mounted on the surface layer 201 being a first conductor layer, and the electrolytic capacitor 321 is mounted on a surface layer 202A being a second conductor layer. In other words, the electronic component 311 and the electrolytic capacitor 321 are mounted on mutually different surfaces of the printed wiring board 200A. The electronic component 312 is mounted on the surface layer 201, and the electrolytic capacitor 322 is mounted on the surface layer 202A. In other words, the electronic component 312 and the electrolytic capacitor 322 are mounted on mutually different surfaces of the printed wiring board 200A. The electronic components 311 and 312 are mounted on an identical surface of the printed wiring board 200A, and the electrolytic capacitors 321 and 322 are mounted on an identical surface of the printed wiring board 200A.

Like the first exemplary embodiment, the electrolytic capacitor 321 is disposed more closely to the electronic component 312 than the electronic component 311. The electrolytic capacitor 322 is also disposed more closely to the electronic component 312 than the electronic component 311.

The printed wiring board 200A has a conductor pattern part 250A. The conductor pattern part 250A has plane-shaped conductor patterns 251A, 252A, and 253A. The conductor patterns 251A, 252A, and 253A are provided on the identical surface layer 202A.

A projected region (first projected region) R1 is a region acquired by projecting the heat radiation pad 341 in the electronic component 311 to the conductor layer 202A in an arrow Z direction perpendicular to the surface of the printed wiring board 200A. A projected region (second projected region) R2 is a region acquired by projecting the heat radiation pad 342 in the electronic component 312 to the conductor layer 202A in an arrow Z direction perpendicular to the surface of the printed wiring board 200A. A projected region (third projected region) R3 is a region acquired by projecting the ground terminal 351G of the electrolytic capacitor 321 to the conductor layer 202A in the arrow Z direction perpendicular to the surface of the printed wiring board 200A. A projected region (fourth projected region) R4 is a region acquired by projecting the ground terminal 352G of the electrolytic capacitor 322 to the conductor layer 202A in the arrow Z direction perpendicular to the surface of the printed wiring board 200A.

A conductor pattern 251A being a first conductor pattern is provided so as to include the projected region R1. A conductor pattern 252A being a second conductor pattern is provided so as to include the projected regions R2 and R3 (or projected regions R2, R3, and R4 more specifically). The conductor pattern 251A and the conductor pattern 252A are spaced from each other.

A conductor pattern 253A being a connection conductor is a third conductor pattern configured to connect the conductor pattern 251A and the conductor pattern 252A. A conductor pattern 253A is provided such that the thermal resistance between the heat radiation pad 341 and the ground terminal 351G can be higher than the thermal resistance between the heat radiation pad 342 and the ground terminal 351G. More specifically, the conductor pattern 253A is narrower than the conductor patterns 251A and 252A. A slit-shaped notch 260A is provided between the conductor pattern 251A and the conductor pattern 252A so that the conductor pattern 251A and the conductor pattern 252A can be connected through the conductor pattern 253A. In other words, the notch 260A is provided between the conductor pattern 251A and the conductor pattern 252A such that the conductor pattern 251A and the conductor pattern 252A can be connected through the narrow conductor pattern 253A. The conductor pattern 253A formed with the notch 260A can bring the conductor pattern 251A and the conductor pattern 252A into conduction and can increase the thermal resistance therein. The notch 260A is provided between the electronic component 311 and the electronic capacitor 321, viewed from the Z direction.

According to the second exemplary embodiment, the conductor pattern 253A is not present on a straight line LA connecting the connection point between the via conductor 261 and the conductor pattern 251A and the connection point between the ground terminal 351G of the electrolytic capacitor 321 and the conductor pattern 252A, viewed from the arrow Z direction. This means that the conductor pattern 253A is provided by avoiding the straight line LA. In other words, the notch 260A is present on the straight line LA.

According to the second exemplary embodiment, as described above, the ground terminal 351G of the electrolytic capacitor 321 is disposed at a position facing the heat radiation pad 341 of the electronic component 311 with the notch 260A interposed therebetween and is provided closely to the electronic component 312.

According to the second exemplary embodiment, as described above, because the conductor pattern 253A is narrower than the conductor patterns 251A and 252A, the thermal resistance between the heat radiation pad 341 and the heat radiation pad 342 can be higher than that in the first exemplary embodiment. This can reduce the influence of thermal interference from the electronic component 311 to the electronic component 312. Thus, the temperature of the electronic component 312 can be reduced more than the first exemplary embodiment, and the size of the printed circuit board can further be reduced.

Because the thus further increased thermal resistance between the ground terminal 351G of the electrolytic capacitor 321 and the heat radiation pad 341 (via conductor 261) can reduce the heat of the electronic component 311 conducted to the electrolytic capacitor 321. Thus, the heat of the electronic component 312 can be conducted effectively to the electrolytic capacitor 321. Therefore, the temperature of the electronic component 312 can effectively be reduced, and the size of the printed circuit board can further be reduced.

The heat conduction path between the ground terminal 351G of the electrolytic capacitor 321 and the via conductor 261 can be redundant because of the notch 260A, the length of the heat conduction path PA (FIG. 4) can be longer than that in the first exemplary embodiment, and the thermal resistance can further be increased than that of the heat conduction path PC. Therefore, the influence of thermal interference from the electronic component 311 to the electronic component 312 can further be reduced, and the temperature of the electronic component 312 can be reduced more effectively. Then, the size of the printed circuit board can further be reduced.

Third Exemplary Embodiment

Figure 6A:
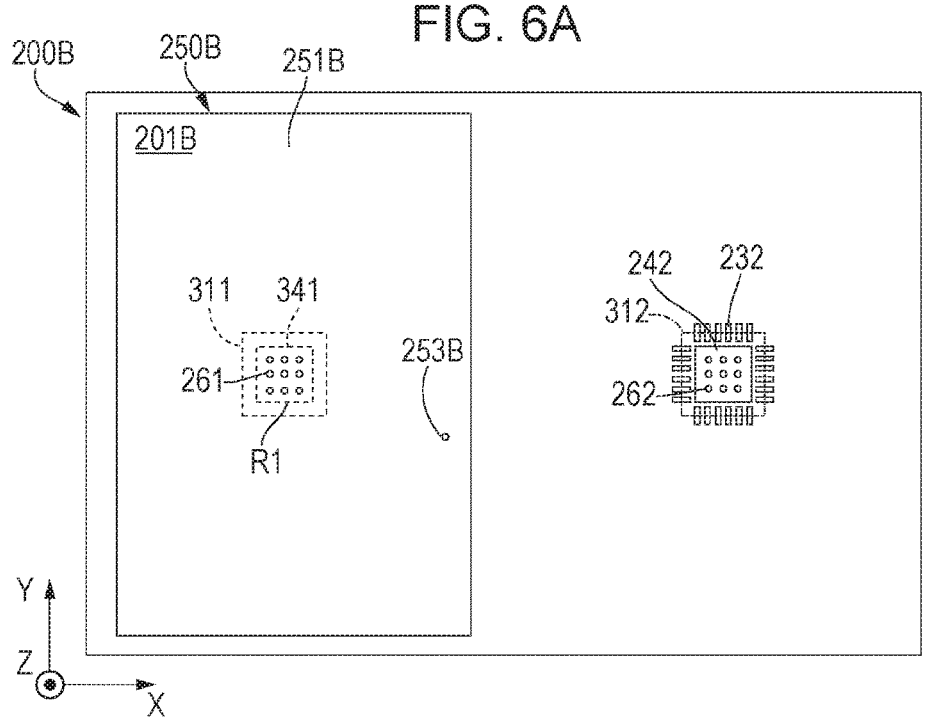
FIG. 6A is a plan view viewed from a −Z direction of a first surface layer of a printed wiring board in a printed circuit board according to a third exemplary embodiment.
Figure 6B:
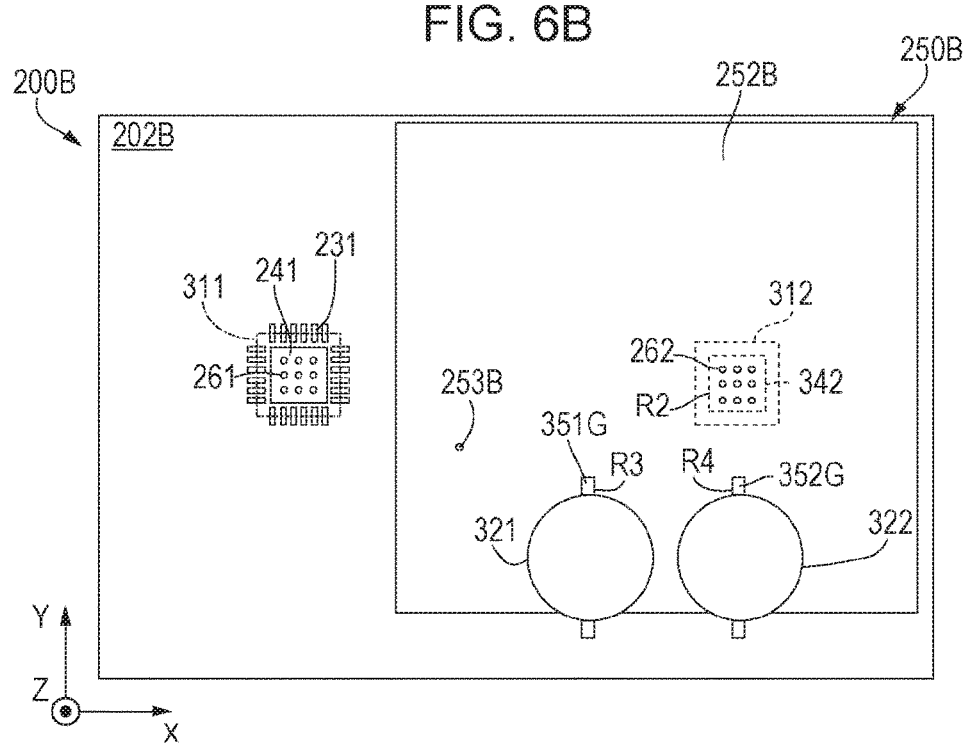
FIG. 6B is a plan view viewed from a −Z direction of a second surface layer of a printed wiring board in a printed circuit board according to the third exemplary embodiment.

Next, a printed circuit board according to a third exemplary embodiment will be described. FIG. 6A is a plan view from a −Z direction of a first surface layer of a printed wiring board in the printed circuit board according to the third exemplary embodiment. FIG. 6B is a plan view from a −Z direction of a second surface layer of the printed wiring board in the printed circuit board according to the third exemplary embodiment. The third exemplary embodiment is different from the first and second exemplary embodiments in the configuration of a conductor pattern component and mounted states of electronic components in the printed wiring board and is the same as the first and second exemplary embodiments in the other configuration. Like numbers refer to like parts in descriptions and illustrations according to the first, second and third exemplary embodiments, and repetitive description will be omitted. FIG. 6B illustrates electrolytic capacitors 321 and 322 by using solid lines for convenience of illustration.

A printed wiring board 200B in the printed circuit board according to the third exemplary embodiment has a plurality of (two in the third exemplary embodiment) conductor layers including conductor layers 201B and 202B stacked through an insulator layer (dielectric layer). According to the third exemplary embodiment, the printed wiring board 200B is a 2-layered printed wiring board. The number of layers in the printed wiring board is not limited to two but may be equal to or higher than three.

According to the third exemplary embodiment, the electronic component 311 and the electrolytic capacitor 321 are mounted on a surface layer 202B being a second conductor layer. In other words, the electronic component 311 and the electrolytic capacitor 321 are mounted on a same surface of the printed wiring board 200B, unlike the first and second exemplary embodiments. The electronic component 312 is mounted on a surface layer 201B, and the electrolytic capacitor 322 is mounted on a surface layer 202B. In other words, the electronic component 312 and the electrolytic capacitor 322 are mounted on mutually different surfaces of the printed wiring board 200B. The electronic component 311 and the electronic component 312 is mounted on mutually different surfaces of the printed wiring board 200B, and the electrolytic capacitors 321 and 322 are mounted on a same surface of the printed wiring board 200B, unlike the first and second exemplary embodiments.

Like the first and second exemplary embodiments, the electrolytic capacitor 321 is disposed more closely to the electronic component 312 than the electronic component 311. The electrolytic capacitor 322 is also disposed more closely to the electronic component 312 than the electronic component 311.

The printed wiring board 200B has a conductor pattern part 250B. The conductor pattern part 250B has plane-shaped conductor patterns 251B and 252B. A conductor pattern 251B is provided on a conductor layer (surface layer) 201B, and a conductor pattern 252B is provided on a conductor layer (surface layer) 202B different from the surface layer 201B. In other words, the conductor pattern 251B is disposed on the opposite surface of the surface having the electronic component 311, and the conductor pattern 252B is disposed on the opposite surface of the surface having the electronic component 312. The conductor pattern 251B and the conductor pattern 252B are connected through a via conductor 253B.

A projected region (first projected region) R1 is a region acquired by projecting the heat radiation pad 341 in the electronic component 311 to the conductor layer 201B in an arrow Z direction perpendicular to the surface of the printed wiring board 200B. A projected region (second projected region) R2 is a region acquired by projecting the heat radiation pad 342 in the electronic component 312 to the conductor layer 202B in an arrow Z direction perpendicular to the surface of the printed wiring board 200B. A projected region (third projected region) R3 is a region acquired by projecting the ground terminal 351G of the electrolytic capacitor 321 to the conductor layer 202B in the arrow Z direction perpendicular to the surface of the printed wiring board 200B. A projected region (fourth projected region) R4 is a region acquired by projecting the ground terminal 352G of the electrolytic capacitor 322 to the conductor layer 202B in the arrow Z direction perpendicular to the surface of the printed wiring board 200B.

A conductor pattern 251B being a first conductor pattern is provided so as to include the projected region R1. A conductor pattern 252B being a second conductor pattern is provided so as to include the projected regions R2 and R3 (or projected regions R2, R3, and R4 more specifically).

The via conductor 253B is a connection conductor configured to connect the conductor pattern 251B and the conductor pattern 252B. The via conductor 253B is provided such that the thermal resistance between the heat radiation pad 341 and the ground terminal 351G can be higher than the thermal resistance between the heat radiation pad 342 and the ground terminal 351G.

According to the third exemplary embodiment, as described above, because the conductor pattern 251B and the conductor pattern 252B are connected through the via conductor 253B, the thermal resistance between the heat radiation pad 341 and the heat radiation pad 342 can be higher than that in the first exemplary embodiment. This can reduce the influence of thermal interference from the electronic component 311 to the electronic component 312. Thus, the temperature of the electronic component 312 can be reduced more than the first exemplary embodiment, and the size of the printed circuit board can further be reduced.

The electronic component 311 and the electronic component 312 are mounted on mutually different surfaces. The path from the ground terminal 351G of the electrolytic capacitor 321 to the via conductor 261 through the via conductor 253B is longer than that in first exemplary embodiment. The thermal resistance of the heat conduction path PA (FIG. 4) between the heat radiation pad 341 and the ground terminal 351G is higher than the thermal resistance of the heat conduction path PC (FIG. 4) between the heat radiation pad 342 and the ground terminal 351G. Furthermore, because the via conductor 253B has a higher thermal resistance than those of the conductor patterns 251B and 252B, the heat conduction path PA (FIG. 4) can have a further higher thermal resistance. Thus, the temperature of the electronic component 312 can effectively be reduced, and the size of the printed circuit board can further be reduced.

Fourth Exemplary Embodiment

Figure 7:
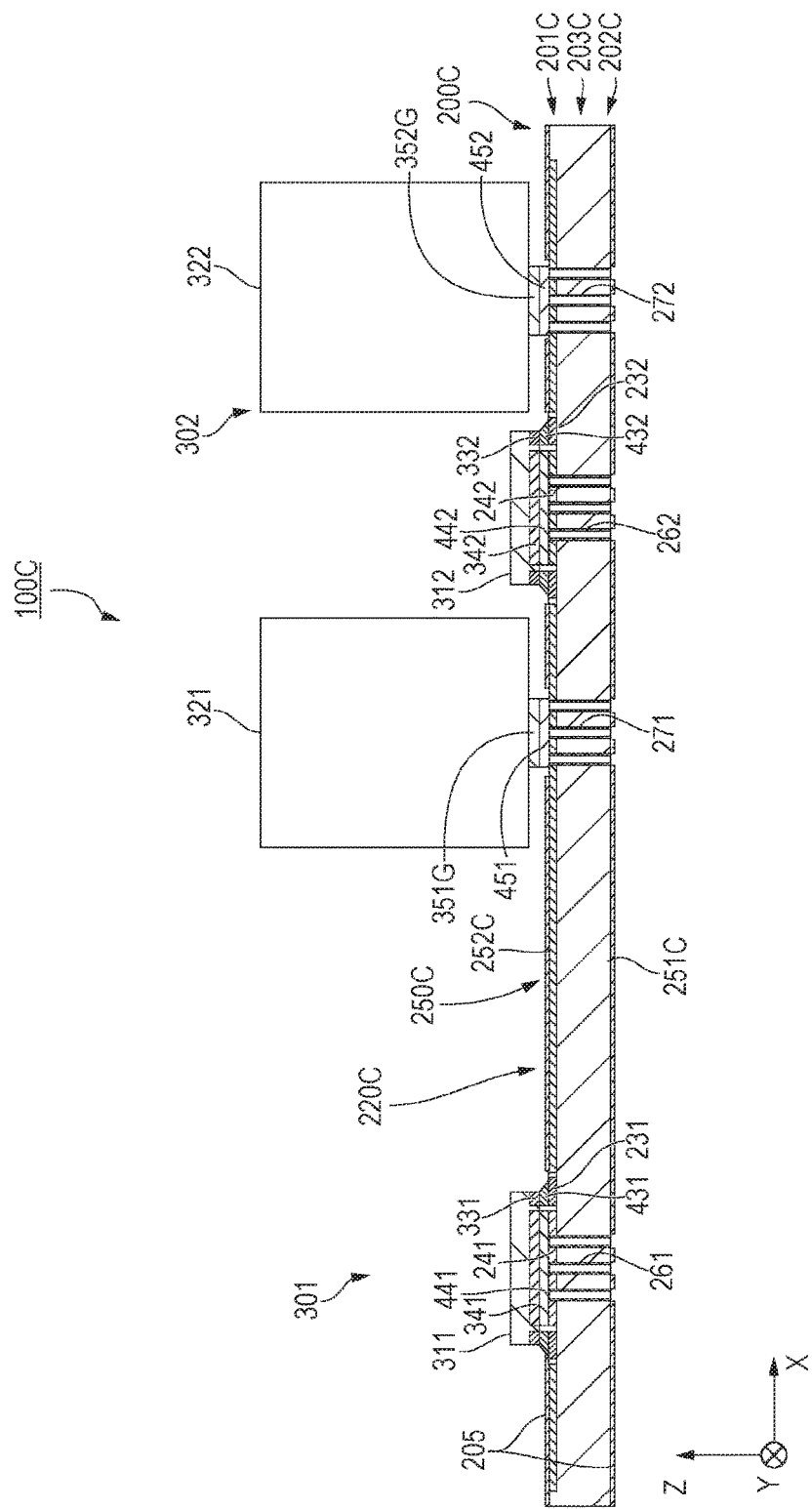
FIG. 7 is a sectional view schematically illustrating a printed circuit board according to a fourth exemplary embodiment.
Figure 8A:
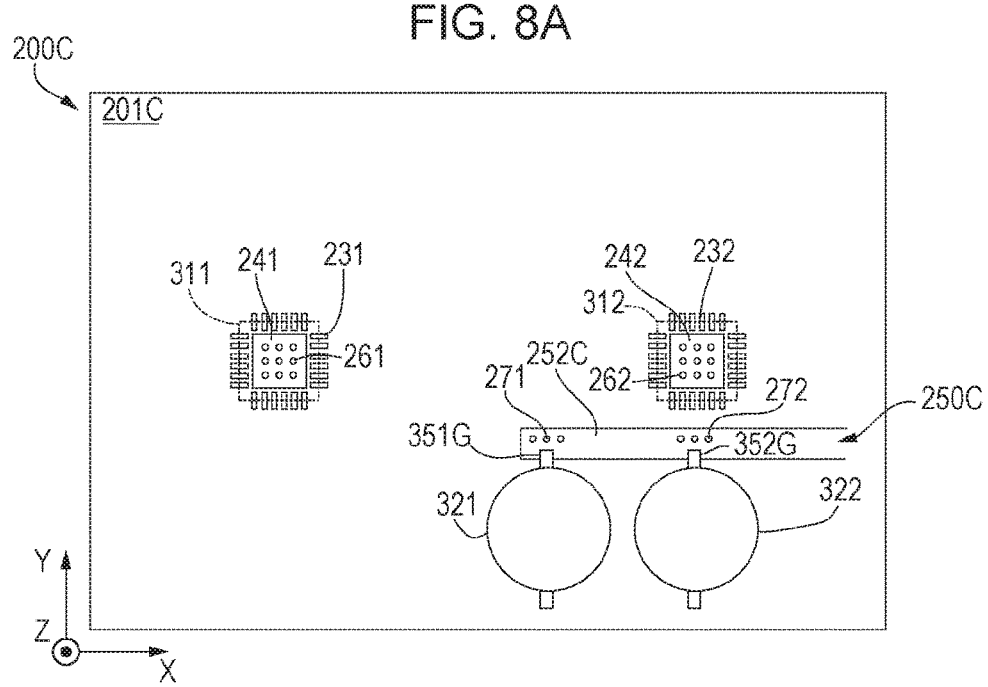
FIG. 8A is a plan view illustrating a first surface layer viewed from a −Z direction of the printed wiring board in the printed circuit board according to the fourth exemplary embodiment.
Figure 8B:
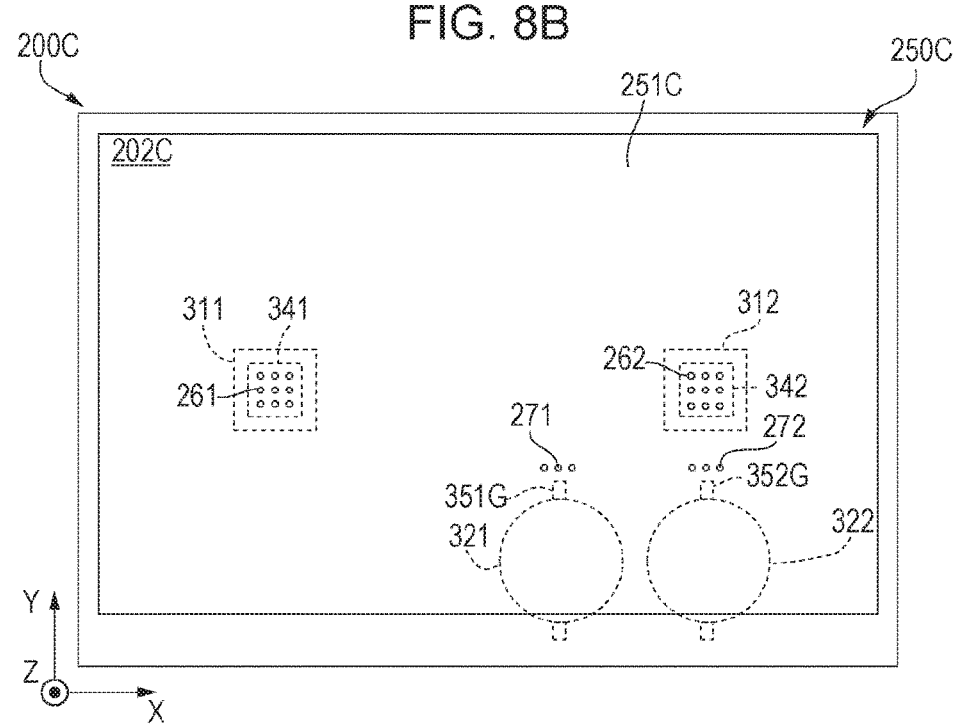
FIG. 8B is a plan view illustrating a second surface layer viewed from the −Z direction of the printed wiring board in the printed circuit board according to the fourth exemplary embodiment.

Next, a printed circuit board according to a fourth exemplary embodiment will be described. FIG. 7 is a sectional view schematically illustrating a printed circuit board according to the fourth exemplary embodiment. FIG. 8A is a plan view illustrating a first surface layer viewed from a −Z direction of the printed wiring board in the printed circuit board according to the fourth exemplary embodiment. FIG. 8B is a plan view illustrating a second surface layer viewed from the −Z direction of the printed wiring board in the printed circuit board according to the fourth exemplary embodiment. The fourth exemplary embodiment is different from the first to third exemplary embodiments in the configuration of a conductor pattern part in the printed wiring board and the mounting of electrolytic capacitors and is the same as the first to third exemplary embodiments in the other configuration. Like numbers refer to like parts in descriptions and illustrations according to the first to fourth exemplary embodiments, and repetitive description will be omitted. FIG. 8B illustrates the electrolytic capacitors 321 and 322 mounted on the printed wiring board 200C for convenience of illustration.

A printed wiring board 200C in a printed circuit board 100C according to the fourth exemplary embodiment has a plurality of (two in the fourth exemplary embodiment) conductor layers including conductor layers 201C and 202C stacked through an insulator layer (dielectric layer). According to the fourth exemplary embodiment, the printed wiring board 200C is a 2-layered printed wiring board. The number of layers in the printed wiring board is not limited to two but may be equal to or higher than three.

According to the fourth exemplary embodiment, the electronic components 311 and 312 and electrolytic capacitors 321 and 322 are mounted on a surface layer 201C being a first conductor layer. In other words, the electronic components 311 and 312 and electrolytic capacitors 321 and 322 are mounted on a same surface of the printed wiring board 200C.

Like the first to third exemplary embodiment, the electrolytic capacitor 321 is disposed more closely to the electronic component 312 than the electronic component 311. The electrolytic capacitor 322 is also disposed more closely to the electronic component 312 than the electronic component 311.

The printed wiring board 200C has plane-shaped conductor patterns 251C and 252C. These conductor patterns 251C and 252C are included in a conductor pattern part 250C. A conductor pattern 251C is provided on a surface layer 202C, and a conductor pattern 252C is provided on a surface layer 201C.

The conductor pattern 251C is provided in a region including the electronic components 311 and 312 and electrolytic capacitor 231,232 viewed from an arrow Z direction perpendicular to the surface of the printed wiring board 200C. More specifically, the conductor pattern 251C is provided so as to include a projected region acquired by projecting the heat radiation pads 341 and 342 of the electronic components 311 and 312 and the ground terminals 351G and 352G of the electrolytic capacitors 231 and 232 to the conductor layer 202C in the arrow Z direction.

The ground terminals 351G and 352G of the electrolytic capacitors 321 and 322 are bonded to the conductor pattern 252C by using jointing materials 451 and 452 of solder, for example.

The heat radiation land 241 and the conductor pattern 251C are connected by using a plurality of via conductors 261, and the heat radiation land 242 and the conductor pattern 251C are connected by using a plurality of via conductors 262.

In vicinity of the ground terminal 351G of the electrolytic capacitor 321, a plurality of (such as three) via conductors 271 is disposed which connects the conductor pattern 251C and the conductor pattern 252C. In vicinity of the ground terminal 352G of the electrolytic capacitor 322, a plurality of (such as three) via conductors 272 is disposed which connects the conductor pattern 251C and the conductor pattern 252C.

According to the fourth exemplary embodiment, by using the heat radiation lands 241 and 242, the conductor patterns 251C and 252C and the via conductors 261, 262, 271, and 272, the ground conductor 220C is provided across the surface layer 201C and the surface layer 202C.

According to the fourth exemplary embodiment, the temperature of the electronic component 312 can be reduced, and the size of the printed circuit board 100C can be reduced, like the first exemplary embodiment. The components 311, 312, 321, and 322 provided on a same surface can improve the degree of freedom in designing the opposite surface of the surface having the components.

An electronic apparatus having the printed circuit board according to an embodiment of the present invention exhibited the excellent performance of heat radiation.

First Example

A printed circuit board according to a first example will be described. In the configuration of the printed circuit board 100 according to the first exemplary embodiment illustrated in FIG. 1, conditions were defined for the printed wiring board 200, electronic component 311, electronic component 312, electrolytic capacitor 321, electrolytic capacitor 322 and jointing materials 441,442,451,452 as follows.

The printed wiring board 200 was a 1.6 [mm]-thick two-layered substrate having a size of 60×60 [mm]. The heat radiation lands 241 and 242 facing the heat radiation pads 341 and 342 of the electronic components 311 and 312 were disposed on the surface having the electronic components 311 and 312. The heat radiation lands 241 and 242 had a size of 2.7 [mm]×2.7 [mm] and a thickness of 0.043 [mm] and was made of Cu.

The plurality of via conductors 261 (262) were formed by forming a total of nine φ0.3 [mm] vias in a 3×3 matrix on the heat radiation lands 241 (242) and were plated within corresponding via holes. The plating was 20 [μm] thick and was made of Cu. The vias were disposed at pitches of 0.7 [mm]. The conductor pattern 250 was disposed on the opposite surface of the surface having the electronic components 311 and 312, had a size of 41 [mm]×14 [mm] (X [mm]×Y [mm]) and was made of Cu.

The electronic components 311 and 312 had package specifications of HQFN, had a size of 4.0 [mm]×4.0 [mm] and was 0.75 [mm] thick. The heat radiation pads 341 and 342 in a central area of the bottom faces of the electronic components 311 and 312 had a size of 2.7 [mm]×2.7 [mm] and were 0.22 [mm] thick. The chip within each of the electronic components 311 and 312 had a size of 2.3 [mm]×1.8 [mm] and was 0.20 [mm] thick.

The electrolytic capacitors 321 and 322 were aluminum electrolytic capacitors and had a cylindrical shape of 3 [mm] radius and were 5.8 [mm] high. The ground terminals 351G and 352G of the electrolytic capacitors 321 and 322 were 0.6 [mm]×2.7 [mm]×0.3 [mm] rectangular parallelepipeds and were provided on the bottom surfaces of the main bodies of the electrolytic capacitors 321 and 322. The central positions of the ground terminals 351G and 352G were disposed at a position at 2.5 [mm] in the Y direction and a position at −2.5 [mm] from the central positions of the main bodies of the electrolytic capacitors 321 and 322, respectively.

The jointing materials 441 and 442 had a size of 2.7 [mm]×2.7 [mm], where 0.05 [mm] thick and were made of Sn—Ag—Cu. The jointing materials 451 and 452 had a size of 0.6 [mm]×2.7 [mm]×0.050 [mm].

The positional conditions for the electronic components 311 and 312 and electrolytic capacitors 321 and 322 will be described. Setting the central positions of the printed wiring board 200 as a point of origin, the central position of the electronic component 311 was disposed at a position at −10.5 [mm] in the X direction from the point of origin, and the electronic component 312 was disposed at a position at 10.5 [mm] in the X direction from the point of origin. The center distance between the electronic component 311 and the electronic component 312 was equal to 21 [mm].

The electrolytic capacitors 321 and 322 were mounted on the opposite surface of the surface having the electronic components 311 and 312. The electrolytic capacitor 321 is disposed at a position at −4 [mm] in the Y direction from the central position of the electronic component 312, and the electrolytic capacitor 322 is disposed at a position at 4 [mm] in the Y direction from the central position of the electronic component 312.

The central position of the conductor pattern 250 was equal to the central position of the printed wiring board 200.

Thermal analysis conditions in the configuration of the first example as described above will be described. The power consumption in the electronic component 311 was assumed as 0.3 [W], and the power consumption in the electronic component 312 was assumed as 0.6 [W]. The center of the upper surface of a silicon chip within the electronic component 312 is analyzed with respect to the junction temperature of the electronic component 312. The same was also applied to the electronic component 311. The ambient temperature of the printed circuit board 100 was defined as 25 [° C.], and the ambient environment was defined as natural convection.

A thermal analysis was performed to evaluate the area (14 [mm]×41 [mm]) of the conductor pattern 250 necessary for the junction temperature of the electronic component 312 to be equal to or lower than 80 [° C.], for example.

As a result of calculation of the thermal resistances of the heat conduction paths PA and PC in the first example, the thermal resistance of the heat conduction path PA was 59 [° C./W], and the thermal resistance of the heat conduction path PC was 15 [° C./W]. The area of the conductor pattern 250 necessary for the junction temperature of the electronic component 312 to be equal to or lower than 80 [° C.] was also acquired.

Figure 9:
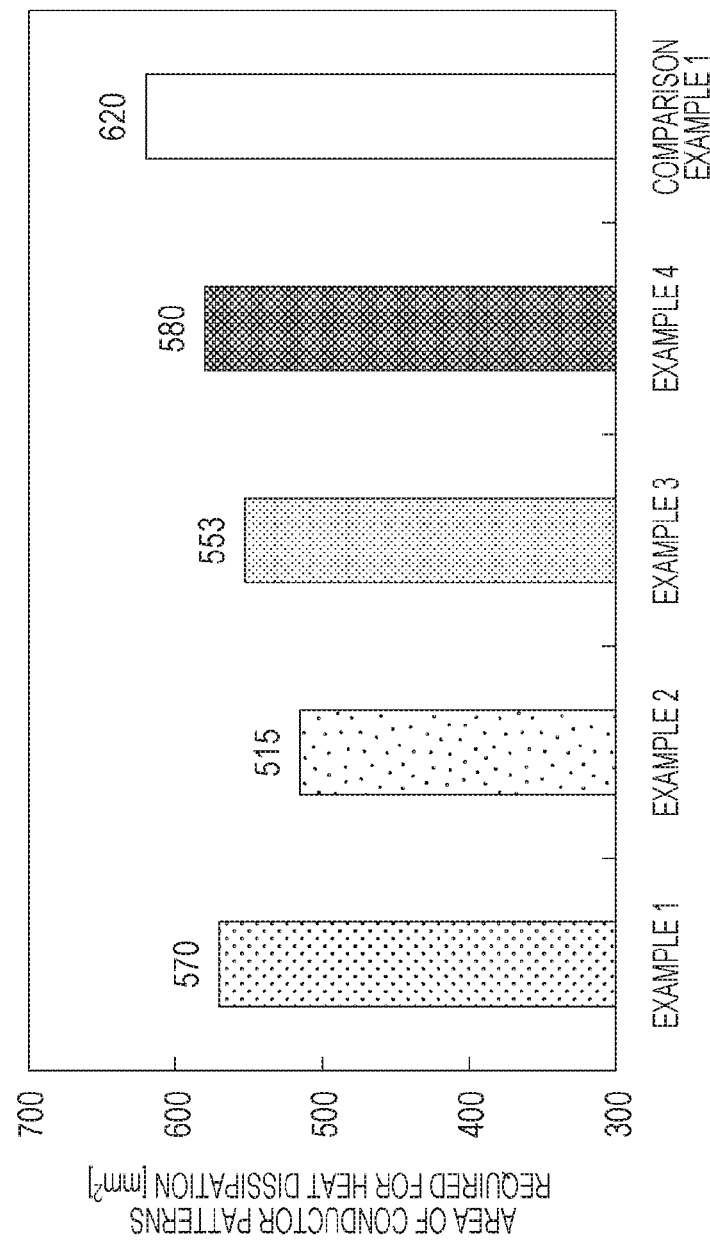
FIG. 9 is a graph illustrating an area of a conductor pattern in printed circuit boards according to the first to third examples and a first comparison example.

FIG. 9 is a graph illustrating an area of a conductor pattern in printed circuit boards according to the first to third examples and a first comparison example. As illustrated in FIG. 9, the area of the conductor pattern 250 was 570 [mm$^2$] (14 [mm]×41 [mm]).

First Comparison Example

Figure 11A:
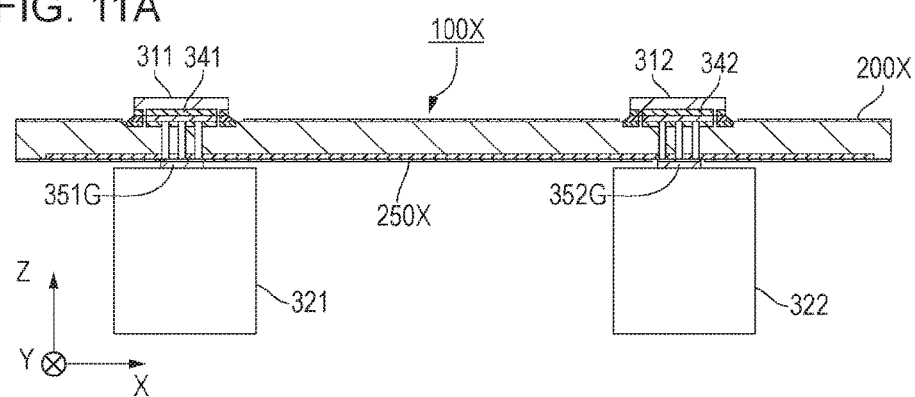
FIG. 11A is a sectional view schematically illustrating a printed circuit board according to the first comparison example.
Figure 11B:
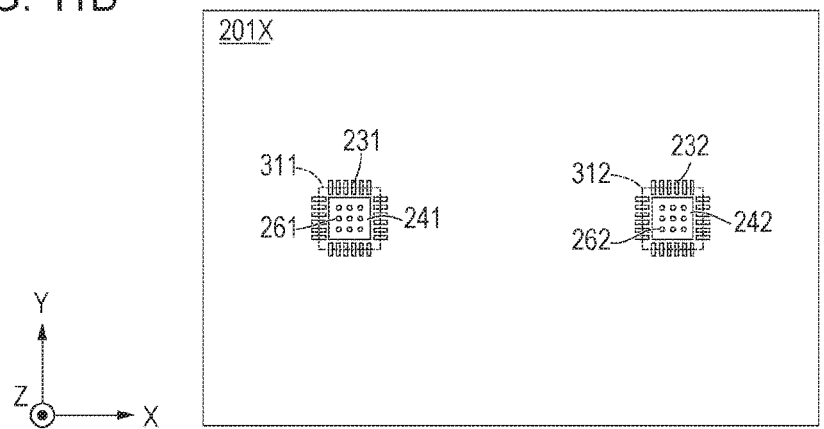
FIG. 11B is a plan view illustrating a first surface layer viewed from the −Z direction of the printed wiring board in the printed circuit board according to the first comparison example.
Figure 11C:
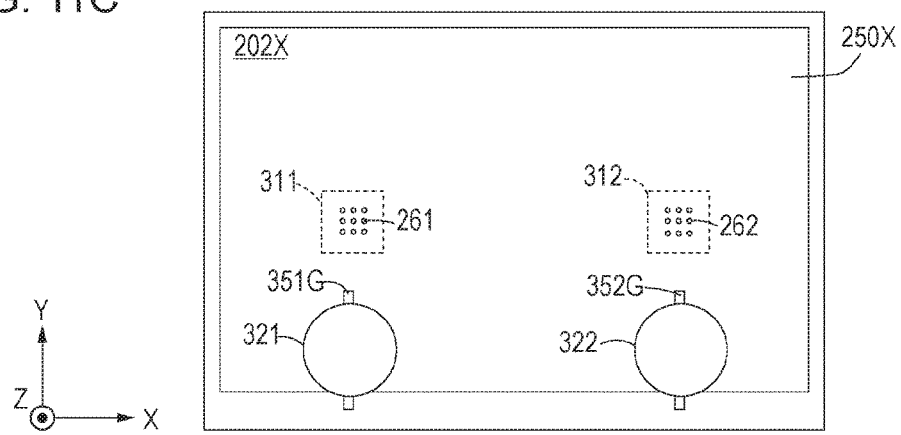
FIG. 11C is a plan view illustrating a second surface layer viewed from the −Z direction of the printed wiring board in the printed circuit board according to the second comparison example.

A printed circuit board according to a first comparison example will be described. The first comparison example is different from the first example in positions of the electrolytic capacitors 321 and 322 being heat absorbing components. FIG. 11A is a sectional view schematically illustrating a printed circuit board according to the first comparison example. FIG. 11B is a plan view illustrating a first surface layer (surface layer 201X) viewed from the −Z direction of the printed wiring board in the printed circuit board according to the first comparison example. FIG. 11C is a plan view illustrating a first surface layer (surface layer 202X) viewed from the −Z direction of the printed wiring board in the printed circuit board according to the second comparison example.

In the configuration of a printed circuit board 100X illustrated in FIG. 11A, the central position of the electrolytic capacitor 321 is the same as the central position of the electronic component 311, and the central position of the electrolytic capacitor 322 is the same as the central position of the electronic component 312, unlike the first example. The first comparison example is also different from the first example in that the conductor pattern 250X of the first comparison example has a size of 44 [mm]×14 [mm] (X [mm]×Y [mm]). For comparison in reduced amount of the area of the conductor pattern, the other configuration of the first comparison example is the same as that of the first example.

The thermal resistance of the heat conduction path PA between the heat radiation pad 341 and the ground terminal 351G of the electrolytic capacitor 321 in the first comparison example was 10.8 [° C./W]. The thermal resistance of the heat conduction path PC between the heat radiation pad 342 and the ground terminal 351G of the electrolytic capacitor 321 in the first comparison example was 50.2 [° C./W]. The area of the conductor pattern 250X necessary for the junction temperature of the electronic component 312 of the printed circuit board 100X to be equal to or lower than 80 [° C.] was acquired. The area of the conductor pattern 250X was 620 [mm$^2$] (44 [mm]×14 [mm]) as illustrated in FIG. 9.

Figure 12:
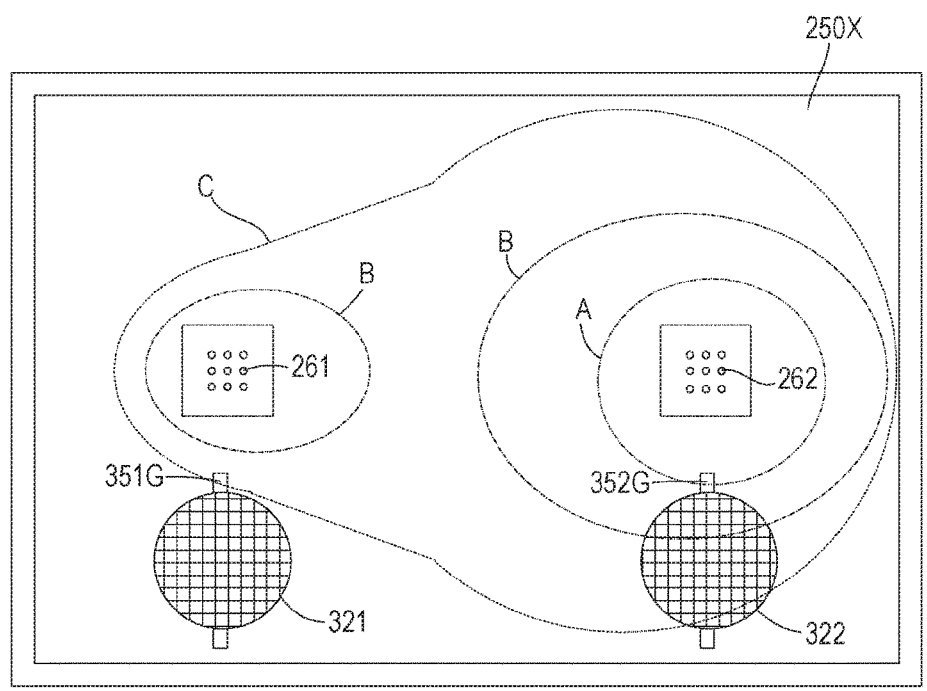
FIG. 12 is a schematic diagram illustrating a heat distribution of a surface opposite against a surface having an electronic component thereon of a printed wiring board in the printed circuit board according to the first comparison example.

FIG. 12 is a schematic diagram illustrating a heat distribution of a surface opposite against a surface having an electronic component thereon of a printed wiring board in the printed circuit board according to the first comparison example. FIG. 12 illustrates regions A, B, and C of a heat distribution representing isotherms of the heat distribution and that the temperatures decrease in order of the regions A, B, and C. In the region B, the heats generated from the electronic component 311 and the electronic component 312 are conducted to the printed wiring board 200X and interfere with each other. In the area C, the heats generated from the electronic component 311 and the electronic component 312 interfere with each other. The heat radiation from the electronic component 312 to the conductor pattern 250X is prevented by the thermal interference from the electronic component 311. As a result, the electronic component 312 has a higher temperature than that of the electronic component 311.

Second Example

A printed circuit board according to a second example will be described. The printed circuit board according to the second example corresponds to the printed circuit board of the second exemplary embodiment illustrated in FIGS. 5A and 5B. In the second example, a conductor pattern part 250A is provided which has a notch 260A on a 37 [mm]×14 [mm] (X [mm]×Y [mm]) conductor pattern. The electrolytic capacitor 321 faces the electronic component 311 with the notch 260A interposed therebetween. The configuration other than the conductor pattern part 250A in the second example is the same as that of the first example.

The notch 260A had a size of 1 [mm]×13.5 [mm] (X [mm]×Y [mm]). The notch 260A was provided at a position at 2 [mm] in the X direction from the central position of the electronic component 311.

The thermal resistance of the heat conduction path PA between the heat radiation pad 341 and the ground terminal 351G in the printed circuit board of the second example was 187 [° C./W], and the thermal resistance of the heat conduction path PC between the heat radiation pad 342 and the ground terminal 351G was 15 [° C./W]. As a result of calculation of an area of the conductor pattern part 250A necessary for the junction temperature of the electronic component 312 to be equal to or lower than 80 [° C.], the area of the conductor pattern part 250A was 515 [mm$^2$] (14 [mm]×37 [mm]) as illustrated in FIG. 9.

Figure 10:
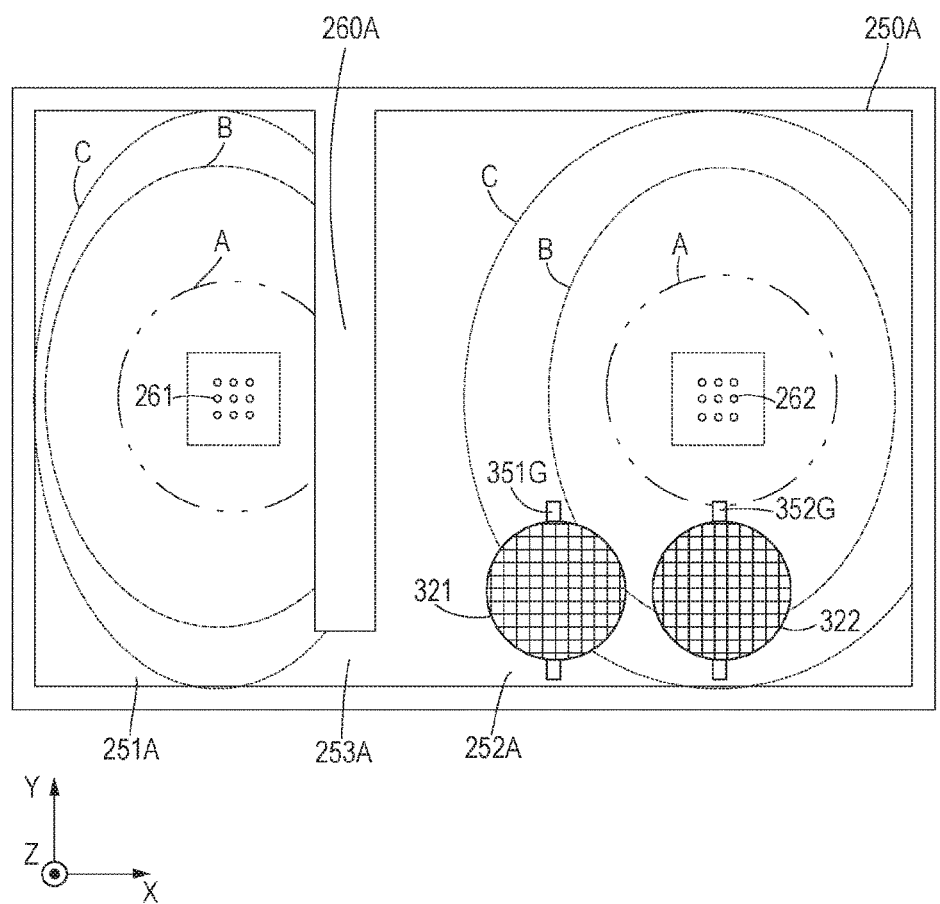
FIG. 10 is a schematic diagram illustrating a heat distribution of the opposite surface of a surface having an electronic component thereon of a printed wiring board in the printed circuit board according to a second example.

FIG. 10 is a schematic diagram illustrating a heat distribution of the opposite surface of a surface having an electronic component thereon of a printed wiring board in the printed circuit board according to the second example. FIG. 10 illustrates regions A, B, and C of a heat distribution representing isotherms of the heat distribution and that the temperatures decrease in order of the regions A, B, and C. From FIG. 12, it may be understood that the notch 260A provided between the electronic component 311 and the electronic component 312 can prevent mutual interferences between heat distributions of the electronic component 311 and the electronic component 312. In other words, because the heats generated from the electronic component 311 and the electronic component 312 do not interfere with each other, the heat radiation from the electronic component 312 can efficiently be performed.

Third Example

A printed circuit board according to a third example will be described. The printed circuit board according to the third example corresponds to the printed circuit board of the third exemplary embodiment illustrated in FIGS. 6A and 6B. The printed circuit board of the third example is different from the printed circuit board of the first example in position of the electronic component 311 and configuration of a conductor pattern part.

A conductor pattern 251B is disposed on the opposite surface of a surface having the electronic component 311. The conductor pattern 251B had a size of 12.5 [mm]×14 [mm] (X [mm]×Y [mm]) and was made of Cu. The central position of the conductor pattern 251B was equal to the central position of the electronic component 311.

A conductor pattern 252B is disposed on the opposite surface of the surface having the electronic component 312. The conductor pattern 252B had a size of 27 [mm]×14 [mm] (X [mm]×Y [mm]) and was made of Cu. The central position of the conductor pattern 252B was equal to the central position of the electronic component 312.

The via conductor 253B was provided at a position at −6.5 [mm] in the X direction and −6 [mm] in the Y direction from the central position of the printed wiring board as the point of origin. The hole diameter of the via having the via conductor 253B was 0.3 [mm]. The thickness of plating provided within the via hole was 20 [μm], and the plating was made of Cu. The via conductor 253B electrically connects the conductor pattern 251B and the conductor pattern 252B. The other configuration of the third example illustrated in FIGS. 6A and 6B is the same as that of the first example.

A thermal analysis was performed to evaluate the area of the conductor pattern part 250B necessary for the junction temperature of the electronic component 312 to be equal to or lower than 80 [° C.], for example, in the printed circuit board of the third example. According to the third example, the area of the conductor pattern part 250B was equal to a sum total of the conductor pattern 251B (12.5 [mm]×14 [mm]) and the conductor pattern 252B (27 [mm]×14 [mm]).

The thermal resistance of the heat conduction path PA between the heat radiation pad 341 and the ground terminal 351G was 77 [° C./W], and the thermal resistance of the heat conduction path PC between the heat radiation pad 342 and the ground terminal 351G was 15 [° C./W].

The area of the conductor pattern part 250B necessary for the junction temperature of the electronic component 312 to be equal to or lower than 80 [° C.] was also acquired. As illustrated in FIG. 9, the area of the conductor pattern part 250B was equal to 553 [mm$^2$] ((12.51 [mm]×14 [mm])+(27 [mm]×14 [mm])).

Fourth Example

A printed circuit board according to a fourth example will be described. The printed circuit board according to the fourth example corresponds to the printed circuit board illustrated in FIG. 7. The printed circuit board of the fourth example is different from the printed circuit board of the first example in positions of the electrolytic capacitors 321 and 322.

The electrolytic capacitors 321 and 322 are mounted on the same surface as the surface having the electronic components 311 and 312. The electrolytic capacitor 321 was mounted at a position at 4 [mm] in the Y direction from the central position of the electronic component 312, and the electrolytic capacitor 322 was mounted at a position at −4 [mm] in the Y direction from the central position of the electronic component 312.

Three via conductors 271 were disposed in vicinity of the ground terminal 351G of the electrolytic capacitor 321. The three via conductors 271 electrically connect the ground terminal 351G of the electrolytic capacitor 321 and a conductor pattern part 250C. The hole diameters of vias having the via conductors 271 are all equal to 0.3 [mm], and the vias are arranged at pitches of 0.8 [mm].

Three via conductors 272 are disposed in vicinity of the ground terminal 352G of the electrolytic capacitor 322. The three via conductors 272 electrically connect the ground terminal 352G of the electrolytic capacitor 322 and the conductor pattern part 250C. The hole diameters of vias having the via conductors 272 are all equal to 0.3 [mm], and the vias are arranged at pitches of 0.8 [mm].

The other configuration of the fourth example illustrated in FIG. 7 is the same as that of the first example.

Performing a thermal analysis on the printed circuit board of the fourth example, the thermal resistance of the heat conduction path PA between the heat radiation pad 341 and the ground terminal 351G was 73 [° C./W], and the thermal resistance of the heat conduction path PC between the heat radiation pad 342 and the ground terminal 351G was 30 [° C./W].

The area of the conductor pattern part 250C necessary for the junction temperature of the electronic component 312 to be equal to or lower than 80 [° C.], for example, was acquired as 580 [mm$^2$] (42 [mm]×14 [mm]).

Because of the difference in thermal resistance between the heat conduction path PA and the heat conduction path PC, how the area of the conductor pattern part necessary for the junction temperature of the electronic component 312 to be equal to or lower than 80 [° C.] changes can be grasped.

The area of a conductor pattern of copper foil necessary for the junction temperature of the electronic component 312 of the first example to be equal to or lower than 80 [° C.] was 570 [mm$^2$] (41 [mm]×14 [mm]). The area in the second example was 515 [mm$^2$] (37 [mm]×14 [mm]). The area in the third example was 553 [mm$^2$] (12.5 [mm]×14 [mm]+27 [mm]×14 [mm]). The area in the fourth example was 559 [mm$^2$] (40 [mm]×14 [mm]). The area in the first comparison example was 620 [ m](44 [mm]×14 [mm]).

When the thermal resistance of the heat conduction path PA is increased to be higher than the thermal resistance of the heat conduction path PC based on the configuration of the first example, the necessary area of the conductor pattern 250 is reduced by about 9.0% of that of the first comparison example.

In the first example, because the thermal resistance of the heat conduction path PA higher than the thermal resistance of the heat conduction path PC allow efficient heat radiation of heat generated from the electronic component 312, the area of the conductor pattern 250 necessary for the heat radiation decreases. In other words, it can reduce the size of the printed circuit board having a plurality of circuit modules having electronic components.

In the second example, the notch 260A provided in the conductor pattern part 250A can further increase the thermal resistance of the heat conduction path PA so that the necessary area of the conductor pattern part 250A decreases. In the second example, compared with the first comparison example, the heat distributions of the electronic component 311 and the electronic component 312 do not interfere with each other because of the notch 260A. Thus, heat generated from the electronic component 312 can efficiently be dissipated more, and the necessary area of the conductor pattern part 250A can be reduced, which thus can reduce the size of the printed circuit board.

Also in the third example, the necessary area of the conductor pattern part 250B decreases more than that in the first comparison example, and the size of the printed circuit board can further be reduced.

Also in the fourth example, the necessary area of the conductor pattern part 250C decreases more than that of the first comparison example, and the size of the printed circuit board can further be reduced.

It should be understood that the present invention is not limited to the aforementioned exemplary embodiments, and many changes, modifications and/or alterations may be made within the technical concept of the invention. The effects of the exemplary embodiments of the present invention were given for illustration only, and effects of the invention are not limited to those of the exemplary embodiments of the present invention.

Having described that the electrolytic capacitors 321 and 322 being the first and second circuit components are aluminum electrolytic capacitors according to the aforementioned exemplary embodiments and examples, the invention is not limited thereto, but other types of electrolytic capacitor are also applicable. The first and second circuit components may be ceramic capacitors without limiting to electrolytic capacitors. The first and second circuit components may be any of other passive elements such as a resistive element and coil, without limiting to capacitors. The first and second circuit components may be active elements without limiting to passive elements. In all of the cases, first and second circuit components having higher heat capacities may be more applicable.

Having described that, according to the aforementioned exemplary embodiments and examples, ground conductors are used to form the heat conduction paths PA to PC, the invention is not limited thereto. Power supply conductors may be used to form the heat conduction paths PA to PC, for example. Because a ground conductor has a wider area than those of other conductors (such as a power supply conductor), ground conductors may be used to form the heat conduction paths PA to PC.

According to the aforementioned exemplary embodiments and examples, each pair of the heat radiation lands 241 and the second heat radiation lands 242, the via conductor 261 and the via conductor 262, the jointing material 441 and the jointing material 442, and the jointing material 451 and the jointing material 452 has an identical configuration. However, they may have different configurations.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-186700, filed Sep. 24, 2015, which is hereby incorporated by reference herein in its entirety.

What is claimed is:

1. A printed circuit board comprising:
   a printed wiring board;
   a first electronic component having a first heat radiation pad;
   a first circuit component provided for the first electronic component and having a first terminal;
   a second electronic component having a second heat radiation pad and generating heat exhibiting a higher heat value than that of the first electronic component;
   a second circuit component provided for the second electronic component and having a second terminal; and
   a conductor provided on the printed wiring board and having a conductor pattern part,
   wherein the first electronic component, the first circuit component, the second electronic component, and the second circuit component are mounted on the printed wiring board, the first heat radiation pad of the first electronic component, the first terminal of the first circuit component, the second heat radiation pad of the second electronic component, and the second terminal of the second circuit component are connected through the conductor; and
   a thermal resistance between the second heat radiation pad and the first terminal is lower than a thermal resistance between the first heat radiation pad and the first terminal.

2. The printed circuit board according to claim 1, wherein the conductor pattern part has a first conductor pattern including a first projected region acquired by projecting the first heat radiation pad in a direction perpendicular to a surface of the printed wiring board, and a second conductor pattern including a second projected region acquired by projecting the second heat radiation pad and a third projected region acquired by projecting the first terminal in the direction perpendicular to the surface of the printed wiring board; and
   the first conductor pattern and the second conductor pattern are connected by using a connection conductor provided such that the thermal resistance between the first heat radiation pad and the first terminal can be higher than the thermal resistance between the second heat radiation pad and the first terminal.

3. The printed circuit board according to claim 2, wherein the first conductor pattern and the second conductor pattern are provided on a same layer in the printed wiring board; and
   the connection conductor is a third conductor pattern narrower than the first conductor pattern and the second conductor pattern provided on the same layer.

4. The printed circuit board according to claim 3, wherein a notch is provided between the first conductor pattern and the second conductor pattern such that the first conductor pattern and the second conductor pattern can be connected through the third conductor pattern.

5. The printed circuit board according to claim 4, wherein the notch is provided between the first electronic component and the first circuit component, viewed from the direction perpendicular to the surface of the printed wiring board.

6. The printed circuit board according to claim 2, wherein the first conductor pattern and the second conductor pattern are provided on different layers in the printed wiring board; and
   the connection conductor is a via conductor provided in the printed wiring board.

7. The printed circuit board according to claim 1, wherein the first and second circuit components are passive elements.

8. The printed circuit board according to claim 7, wherein the passive elements are aluminum electrolytic capacitors.

9. The printed circuit board according to claim 1, wherein the conductor is a ground conductor, and the first terminal and the second terminal are ground terminals connected to the ground conductor.

10. The printed circuit board according to claim 9, wherein the first electronic component has a power supply terminal connected to a power supply terminal of the first circuit component by using a first power supply conductor provided on the printed wiring board, and the second electronic component has a power supply terminal connected to a power supply terminal of the second circuit component by using a second power supply conductor provided on the printed wiring board.

11. The printed circuit board according to claim 1, wherein the first electronic component and the first circuit component are mounted on mutually different surfaces or a same surface of the printed wiring board.

12. The printed circuit board according to claim 1, wherein the second electronic component and the second circuit component are mounted on mutually different surfaces or a same surface of the printed wiring board.

13. An electronic apparatus comprising the printed circuit board according to claim 1.

* * * * *